US008130995B2

(12) United States Patent
Her et al.

(10) Patent No.: US 8,130,995 B2
(45) Date of Patent: Mar. 6, 2012

(54) EARPIECE DEVICE WITH MICROPHONE

(75) Inventors: Hong-Ching Her, Taichung (TW); Hung-Yue Chang, Taichung (TW); Ton-Kun Ho, Taichung (TW)

(73) Assignee: Merry Electronics Co., Ltd., Taichung (TW)

( * ) Notice: Subject to any disclaimer, the term of this patent is extended or adjusted under 35 U.S.C. 154(b) by 1112 days.

(21) Appl. No.: 11/946,894

(22) Filed: Nov. 29, 2007

(65) Prior Publication Data

US 2009/0141924 A1 Jun. 4, 2009

(51) Int. Cl.

| | |
|---|---|
| ***H04R 25/00*** | (2006.01) |
| ***H04R 1/10*** | (2006.01) |
| ***H04R 3/00*** | (2006.01) |
| ***H03B 29/00*** | (2006.01) |
| ***H04M 1/00*** | (2006.01) |

(52) U.S. Cl. ........ 381/380; 381/71.6; 381/71.7; 381/72; 381/74; 381/92; 381/328; 381/330; 381/370; 381/371; 381/375; 381/376; 381/382; 379/430; 379/433.03

(58) Field of Classification Search .................... 381/92, 381/328, 330, 370, 371, 375, 376, 380, 382, 381/71.6, 71.7, 72, 74; 379/430, 433.03
See application file for complete search history.

(56) References Cited

U.S. PATENT DOCUMENTS

| | | | | |
|---|---|---|---|---|
| 5,125,032 | A * | 6/1992 | Meister et al. | 381/72 |
| 5,692,059 | A * | 11/1997 | Kruger | 381/151 |
| 5,909,498 | A * | 6/1999 | Smith | 381/380 |
| 6,327,370 | B1 * | 12/2001 | Killion et al. | 381/313 |
| 2003/0165249 | A1 * | 9/2003 | Higuchi | 381/318 |
| 2006/0050917 | A1 * | 3/2006 | Skillicorn et al. | 381/384 |
| 2006/0291679 | A1 * | 12/2006 | Burns | 381/313 |
| 2007/0003094 | A1 | 1/2007 | Chen | |
| 2007/0047739 | A1 | 3/2007 | Tsai | |

FOREIGN PATENT DOCUMENTS

| | | |
|---|---|---|
| TW | M277219 U | 10/2005 |
| TW | M297606 | 9/2006 |
| TW | M309828 | 4/2007 |

* cited by examiner

*Primary Examiner* — Elvin G Enad
*Assistant Examiner* — Tsz Chan
(74) *Attorney, Agent, or Firm* — Chun-Ming Shih

(57) ABSTRACT

An earpiece device includes a housing having a sound output portion, a speaker and a microphone. The speaker disposed in the housing includes a diaphragm and a sound transmitting hole. The diaphragm is located between the sound output portion and the sound transmitting hole. The microphone is disposed in the housing and covers the sound transmitting hole. A sound wave generated within an ear canal would be received by the speaker and delivered through the sound transmitting hole to the microphone for pickup.

12 Claims, 2 Drawing Sheets

EARPIECE DEVICE WITH MICROPHONE

BACKGROUND

1. Technical Field

The present invention generally relates to earpiece devices and, particularly, to an earpiece device with microphone.

2. Description of the Related Art

Referring to FIG. 4, a conventional earpiece device 40 includes a main body having an extension arm 41, a speaker 42, a microphone 43 and an ear-hook 44. The speaker 42 is disposed in the rear portion of the main body. The microphone 43 is secured in an end portion of the extension arm 41. When the earpiece device 40 is held on the ear of a user by the ear-hook 44 and the microphone 43 is positioned near the user's mouth, the earpiece device 40 can operatively output sound to the user's ear and pick up the user's voice.

However, when the earpiece device 40 is in operation, the microphone 43 not only picks up the user's voice but also the background noise, which results in the sound quality of the microphone unsatisfactory.

BRIEF SUMMARY

An object of the present invention is to provide an improved earpiece device, the earpiece device is incorporated with a microphone for picking up sound wave generated within an ear canal, so that the influence of the background noise can be effectively avoided.

In order to achieve the above-mentioned object, an earpiece device, in accordance with a present embodiment, is provided. The earpiece device includes a housing, a speaker and a microphone. The housing has a sound output portion. The speaker disposed in the housing includes a diaphragm and a sound transmitting hole. The diaphragm is located between the sound output portion and the sound transmitting hole. The microphone is disposed in the housing and covers the sound transmitting hole of the speaker. A sound wave generated within an ear canal would be received by the speaker and delivered through the sound transmitting hole to the microphone for pickup.

Due to the fact that the speaker is designed to have the sound transmitting hole formed thereon, the sound wave generated within the ear canal can be effectively delivered to the microphone disposed in the earpiece device. Therefore, it is unnecessary to dispose a microphone outside of the earpiece device as the conventional earpiece device.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention.

Figure 1:
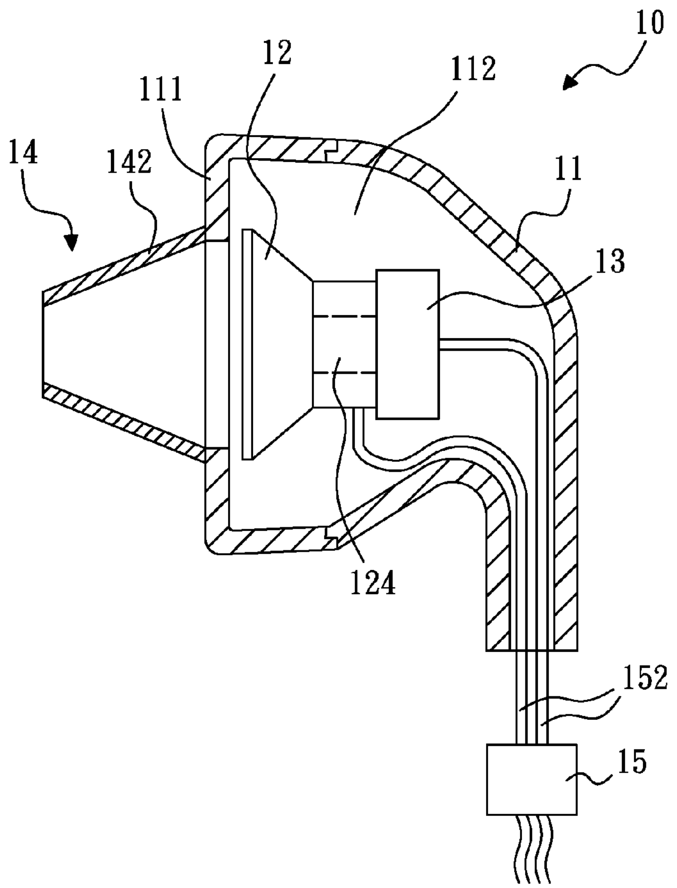
FIG. 1 is a schematic, partially cross-sectional view of an earpiece device, in accordance with a first embodiment.
Figure 2:
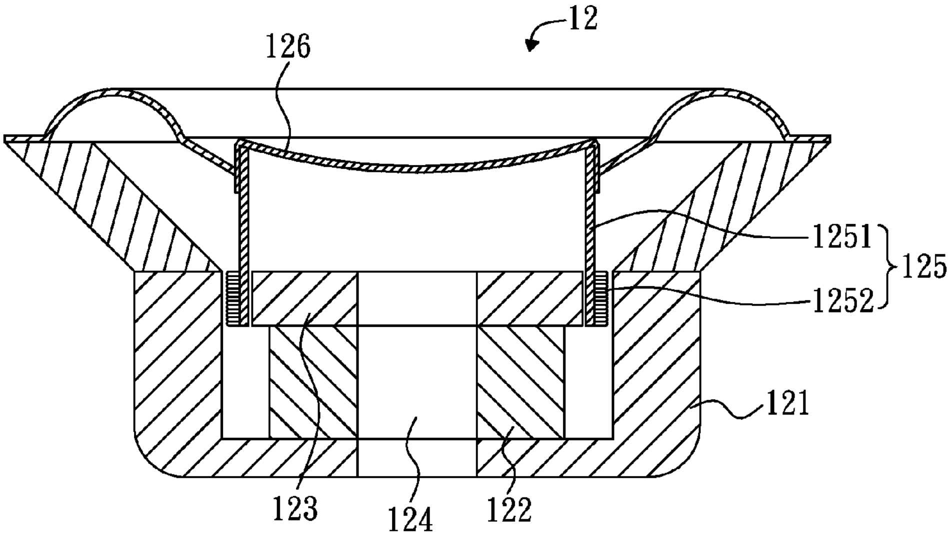
FIG. 2 is a schematic, cross-sectional view of a speaker of FIG. 1.

Referring to FIGS. 1 and 2, an earpiece device 10, in accordance with a first embodiment, is provided. The earpiece device 10 includes a housing 11, a speaker 12 and a microphone 13.

The housing 11 has a space 112 for receiving the speaker 12 and the microphone 13 therein. The housing 11 includes a sound output portion 111 having a sound output hole formed therethrough (not labeled).

The speaker 12 disposed in the housing 11 includes a diaphragm 126 and a sound transmitting hole 124. The diaphragm 126 is located between the sound output portion 111 and the sound transmitting hole 124. In particular, the diaphragm 126 faces toward the sound output portion 111. Furthermore, the sound transmitting hole 124 is formed on an end portion of the speaker 12 opposite to the diaphragm 126 thereof, for enabling sound waves generated within an ear canal to be transmitted therethrough.

As shown in FIG. 2, the speaker 12 further includes a magnetic base 121, a magnet 122, a magnetic conductive plate 123 and a voice coil 125. The magnetic base 121 has an approximately U-shaped cross section. The magnet 122 is disposed on an inner bottom surface of the magnetic base 121. The magnetic conductive plate 123 is disposed on a side of the magnet 122 apart from the inner bottom surface of the magnetic base 121. The magnetic conductive plate 123 and an inner sidewall of the magnetic base 121 cooperatively form a gap (not labeled) therebetween. The voice coil 125 includes a hollow bobbin 1251 and a coil 1252 wound around and fixed to an end portion of the hollow bobbin 1251. An end of the voice coil 125 wound with the coil 1252 is inserted into the gap and the opposite end is mechanically connected with diaphragm 126. The sound transmitting hole 124 sequentially penetrates through the magnetic base 121, the magnet 122 and the magnetic conductive plate 123 so as to communicate with the hollow bobbin 1251 of the voice coil 125.

The operating principle of the speaker 12 is generally described as follows. Magnetic force lines produced from the magnet 122 flow toward the magnetic conductive plate 123 and then radially pass across the gap. Thereafter, the magnetic force lines return back the magnet 122 via the magnetic base 121 so that a magnetic flux loop is established. When an electric signal is fed to the coil 1252 of the voice coil 125, the voice coil 125 produces a magnetic field in response to the feed of the electrical signal. The interaction (e.g., attraction or repulsion) between the magnetic fields respectively produced by the voice coil 125 and the magnet 122 would cause the diaphragm 126 to oscillate and thus a sound corresponding to the fed electrical signal will be broadcasted.

The microphone 13 is disposed in the housing 11 and covers the sound transmitting hole 124. It is noted that, when speaking, people not only can output sound wave through the vocal tract, but also generate the same sound wave within an ear canal because of the ear canal being communicated with the throat. The sound wave generated within the ear canal can be delivered to the microphone 13 for pickup through the diaphragm 126 and the sound transmitting hole 124 of the speaker 12.

Further, the earpiece device 10 includes an ear tip 14 secured on the housing 11 and shaped for fitting in the ear canal. The ear tip 14 includes a hollow tube 142 for forming an acoustic channel. The hollow tube 142 is acoustically coupled to the sound output portion 111 of the housing 11. More specifically, the hollow tube 142 communicates with the space 112 via the sound output hole of sound output portion 111. The hollow tube 142 is configured to deliver the sound broadcasted by the speaker 12 into the ear canal for hearing by the user and deliver the sound wave generated within the ear canal of the user to the diaphragm 126. The sound wave will be delivered to the microphone 13 by the sound transmitting hole 124. The microphone 13 picks up the sound wave and converts the picked up sound wave into a corresponding electrical signal.

In addition, the earpiece device 10 may further include a controller 15 electrically/electronically connected with the speaker 12 and the microphone 13. The controller 15 is configured to transmit an inputted electrical signal to the speaker 12 for broadcasting sound and output another electrical signal generated by the microphone 13 after the microphone 13 picking up the sound wave. In particular, the controller 15 is electronically connected with the speaker 12 and the microphone 13 through multiple signal transmission cables 152. The controller 15 can be designed to dispose inside or outside of the housing 11 according to the practical requirements. Preferably, the controller 15 has a signal amplifying unit (not shown) incorporated therein, for amplifying the electrical signal generated by the microphone 13.

Figure 3:
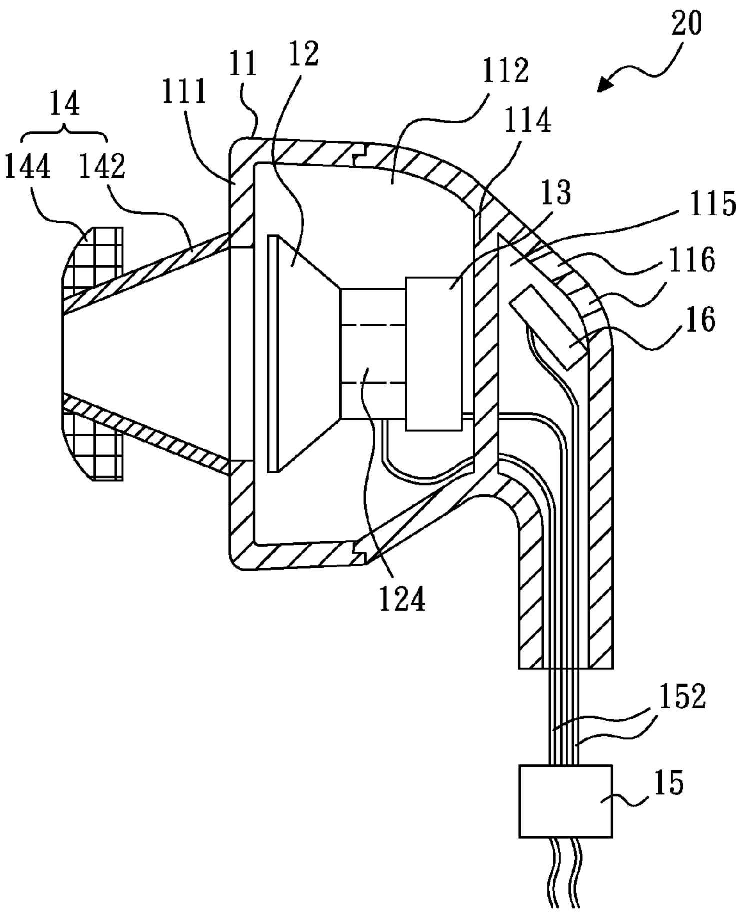
FIG. 3 is a schematic, partially cross-sectional view of an earpiece device, in accordance with a second embodiment.
Figure 4:
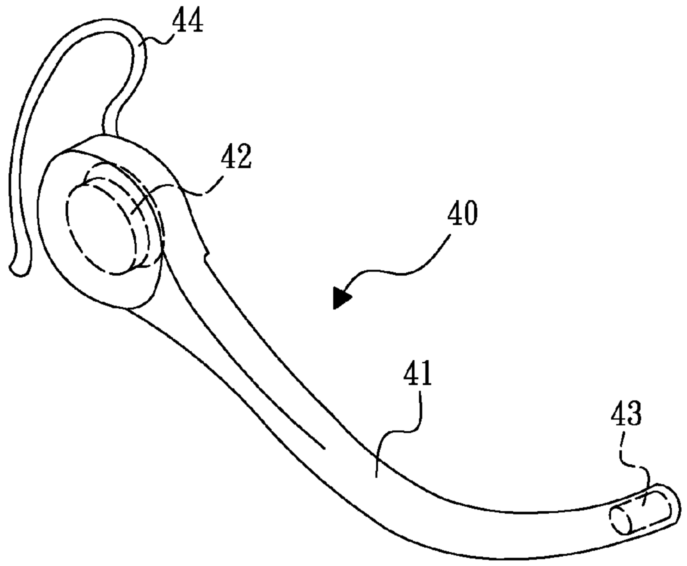
FIG. 4 (prior art)
FIG. 4 is a schematic view of a conventional earpiece device.

Referring to FIG. 3, an earpiece device 20, in accordance with a second embodiment, is provided. The earpiece device 20 is similar to the earpiece device 10 of the first embodiment. Differences of the earpiece device 20 from the earpiece device 10 are that: the ear tip 14 further includes a sound isolation element 144, e.g., a sponge cover sleeved on the hollow tube 142 and used for isolation of the background noise. The earpiece device 20 further includes an outward microphone 16, and a second space 115 correspondingly is formed in the space 112 of the housing 11 by a separation plate 114. The outward microphone 16 is disposed in the second space 115. The housing 11 has a plurality of through holes 116 formed thereon to allow the second space 115 to communicate with the outside environment. The separation plate 114 separates the microphone 13 and the outward microphone 16 into two isolated spaces, which can effectively avoid the influence of background noise from the outside environment to be applied to the microphone 13. The outward microphone 16 is electronically connected with the controller 15 via one of the signal transmission cables 152. The outward microphone 16 is configured to pick up voice from the outside environment through the through holes 116 and convert the picked up voice into a corresponding electrical signal. The electrical signal would be transmitted to the speaker 12 by the controller 15 so that the voice can be broadcasted to the user for hearing. Further, when the controller 15 is incorporated a signal amplifying unit therein, the controller 15 can amplify the electrical signal generated by the outward microphone 16 so that the earpiece device 20 can function as a hearing aid. Even further, the controller 15 can further incorporate a signal filtering unit, a filter or a digital signal processor (DSP) unit (not shown) therein, for processing the electrical signal generated by the outward microphone 16 so as to reduce background noise picked up by the outward microphone 16 in electronic manner. As a result, the voice picked up by the outward microphone 16 may be clearly broadcasted by the speaker 12.

It is understood that the housing 11 may not have the separation plate 114 formed therein, so that the outward microphone 16 and the microphone 13 are located in a same space. In addition, the outward microphone 16 is not limited to be disposed in the housing 11, and may be disposed outside of the housing 11.

In summary, by the particular design for the earpiece devices of the present invention, e.g., forming a sound transmitting hole 124 on the speaker 12, sound wave generated within the ear canal can be effectively delivered to the microphone 13 for pickup by the sound transmitting hole 124. Therefore it is unnecessary to dispose a microphone outside of the earpiece device as the conventional earpiece device. Furthermore, in the case of that the earpiece device is equipped with the outward microphone for picking up voice from outside environment and the controller is incorporated the signal amplifying unit therein for amplifying the electrical signal generated by the outward microphone before being transmitted to the speaker for broadcasting, the earpiece device can be used as a hearing aid.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. An earpiece device, comprising:

a housing having a sound output portion;

a speaker disposed in the housing, the speaker comprising a first end portion and an opposite second end portion, a diaphragm disposed at the first end portion, a sound transmitting hole defined through the second end portion, the diaphragm being located between the sound output portion and the sound transmitting hole, the sound transmitting hole having a first open end directly facing the diaphragm and an opposite second open end; and a microphone disposed in the housing, the microphone directly attached to and covering the second open end of the sound transmitting hole;

wherein a sound wave generated within an ear canal is received by the speaker and delivered through the sound transmitting hole to the microphone for pickup.

2. The earpiece device according to claim 1, wherein the diaphragm faces toward the sound output portion of the housing, and the sound wave is delivered to the microphone through the diaphragm and the sound transmitting hole.

3. The earpiece device according to claim 1, further comprising an ear tip secured on the housing and shaped for fitting in the ear canal.

4. The earpiece device according to claim 3, wherein the ear tip comprises a hollow tube acoustically coupled to the sound output portion of the housing.

5. The earpiece device according to claim 4, wherein the ear tip further comprises a sound isolation member sleeved on the hollow tube.

6. The earpiece device according to claim 1, further comprising a controller electronically connected with the speaker and the microphone, the controller configured for transmitting an inputted electrical signal to the speaker for broadcasting sound and outputting another electrical signal generated by the microphone after the microphone picking up the sound wave.

7. The earpiece device according to claim 6, wherein the controller is incorporated a signal amplifying unit therein, the signal amplifying unit being configured for amplifying the electrical signal generated by the microphone.

8. The earpiece device according to claim 6, further comprising another microphone electronically connected with the controller, the another microphone being configured for picking up voice from outside environment, converting the voice into a corresponding electrical signal and inputting the electrical signal into the controller for amplifying.

9. The earpiece device according to claim 8, wherein the controller further comprises one of a signal filtering unit, a filter and a digital signal processor unit, for processing the electrical signal generated by the another microphone so as to reduce background noised picked up by the another microphone.

10. The earpiece device according to claim 8, wherein the housing has a plurality of through holes formed thereon, and the another microphone is disposed in the housing for picking up the voice from the outside environment through the through holes.

11. The earpiece device according to claim 10, wherein the housing further has a separation plate formed therein, and the separation plate separates the microphone and the another microphone into two isolated spaces.

12. The earpiece device according to claim 1, wherein the speaker further comprises a magnetic base, a magnet, a magnetic conductive plate and a voice coil, the magnet is disposed on the magnetic base, the magnetic conductive plate is disposed on the magnet so as to allow a gap to be formed between the magnetic conductive plate and an inner sidewall of the magnetic base, the voice coil comprises a hollow bobbin and a coil wound around and fixed to an end portion of the hollow bobbin, an end of the voice coil wound with the coil is inserted into the gap and another end thereof is mechanically connected with the diaphragm, and the sound transmitting hole sequentially penetrates through the magnetic base, the magnet and the magnetic conductive plate so as to communicate with the hollow bobbin of the voice coil.

* * * * *